United States Patent
Nguyen

(10) Patent No.: US 7,946,433 B2
(45) Date of Patent: *May 24, 2011

(54) INTERLOCKING UPRIGHT RACK MEMBERS

(75) Inventor: Tri H. Nguyen, Richardson, TX (US)

(73) Assignee: Telect Inc., Liberty Lake, WA (US)

( * ) Notice: Subject to any disclaimer, the term of this patent is extended or adjusted under 35 U.S.C. 154(b) by 724 days.

This patent is subject to a terminal disclaimer.

(21) Appl. No.: 11/275,344

(22) Filed: Dec. 27, 2005

(65) Prior Publication Data

US 2007/0144982 A1    Jun. 28, 2007

(51) Int. Cl.
*A47F 7/00* (2006.01)
(52) U.S. Cl. .......................... 211/26; 211/175
(58) Field of Classification Search .................. 211/26, 211/189, 187, 186, 94.02, 103, 175, 207; 312/265.1, 265.2, 265.3, 265.4, 223.1, 205, 312/265.5, 256.6; 52/67, 36.5; 220/677, 220/682, 692; 49/504, 505; 439/532, 716, 439/717
See application file for complete search history.

(56) References Cited

U.S. PATENT DOCUMENTS

| | | | | |
|---|---|---|---|---|
| 332,558 A * | 12/1885 | Wilson | ............................ | 126/14 |
| 2,853,161 A * | 9/1958 | Mascari | ............................ | 52/212 |
| 4,523,722 A * | 6/1985 | Cohen et al. | ............................ | 211/175 |
| 4,643,319 A | 2/1987 | Debus et al. | | |
| 4,715,502 A * | 12/1987 | Salmon | ............................ | 211/26 |
| 4,922,659 A * | 5/1990 | Muccioli | ............................ | 49/501 |
| 4,964,020 A * | 10/1990 | Savage et al. | ............................ | 361/829 |
| 5,192,019 A | 3/1993 | Meehan | | |
| 5,250,752 A | 10/1993 | Cutright | | |
| 5,383,723 A | 1/1995 | Meyer | | |
| 5,697,811 A * | 12/1997 | Pickles et al. | ............................ | 439/532 |
| 5,703,327 A * | 12/1997 | Jorgensen | ............................ | 174/53 |
| 5,749,476 A | 5/1998 | Besserer et al. | | |
| 5,810,459 A * | 9/1998 | Barrett et al. | ............................ | 312/111 |
| 5,820,289 A | 10/1998 | Kern et al. | | |
| 5,930,972 A | 8/1999 | Benner et al. | | |
| 6,012,790 A * | 1/2000 | Thomas et al. | ............................ | 312/257.1 |
| 6,019,446 A | 2/2000 | Laboch et al. | | |
| 6,027,192 A | 2/2000 | Irace | | |
| 6,039,420 A | 3/2000 | Besserer et al. | | |
| 6,047,838 A | 4/2000 | Rindoks et al. | | |
| 6,123,400 A | 9/2000 | Nicolai et al. | | |
| 6,206,494 B1 | 3/2001 | Benner et al. | | |
| 6,223,908 B1 | 5/2001 | Kurtsman | | |
| 6,293,637 B1 | 9/2001 | Anderson et al. | | |
| 6,416,339 B1 * | 7/2002 | Snow et al. | ............................ | 439/215 |
| 6,561,603 B2 | 5/2003 | Knab et al. | | |
| 6,605,777 B1 | 8/2003 | Anderson et al. | | |
| 6,655,533 B2 * | 12/2003 | Guebre-Tsadik | ............................ | 211/26 |
| 6,796,622 B2 * | 9/2004 | Nielsen | ............................ | 312/205 |
| 6,912,822 B2 * | 7/2005 | Vos | ............................ | 52/522 |
| 6,945,518 B1 * | 9/2005 | Chrysler | ............................ | 256/25 |
| 7,259,326 B2 | 8/2007 | Nguyen | | |
| 2002/0020325 A1 * | 2/2002 | MacDonald | ............................ | 105/355 |

(Continued)

OTHER PUBLICATIONS www.hoffmanonline.com, Product Catalog, DataCom Products, 4-Post Open Frame Racks, Spec Sheet PDF file, (c) 2007, archived version (c) 2002.

(Continued)

*Primary Examiner* — Darnell M Jayne
*Assistant Examiner* — Stanton L Krycinski
(74) *Attorney, Agent, or Firm* — Lee & Hayes, PLLC

(57) ABSTRACT

Embodiments of interlocking uprights members for a telecommunications equipment cabinet are presented herein. The uprights include first and second areas that engage in an interlocking and alternating overlap so that the uprights interlock in a plurality of positions to vary a dimension of the cabinet.

14 Claims, 12 Drawing Sheets

U.S. PATENT DOCUMENTS

| | | |
|---|---|---|
| 2002/0046979 A1 | 4/2002 | Larsen et al. |
| 2002/0117462 A1* | 8/2002 | Hung .......................... 211/189 |
| 2003/0062326 A1 | 4/2003 | Guebre-Tsadik |
| 2004/0080244 A1 | 4/2004 | Lowther, Jr. et al. |
| 2006/0016774 A1* | 1/2006 | Bustos ........................ 211/186 |

OTHER PUBLICATIONS

U.S. Appl. No. 11/275,341.
U.S. Appl. No. 11/275,342.
U.S. Appl. No. 11/275,345.

* cited by examiner

900

902
Forming a Pair of Identical
Uprights Members

904
Joining the Uprights
Members in 180 Rotational
Relation to Form a
Variable Depth Side Wall
of a Telecommunications
Equipment Cabinet.

1002
Forming a Groove Configured to Receive a Structural Insert in a Portion of a Telecommunications Cabinet

1004
Removably Embedding a Structural Insert in the Groove to Modify a Structural Characteristic the Cabinet

1102
Removably Fastening a Mounting Member to a Support Structure of a Telecommunications Cabinet

↓

1104
Securing one or more Telecommunication Component to the Cabinet via the Mounting Member

1202
Forming a Pair of Identical Sub-Assemblies

1204
Joining the Identical Sub-Assemblies to Form an Adjustable Depth Telecommunication Equipment Cabinet

*Fig. 12*

INTERLOCKING UPRIGHT RACK MEMBERS

FIELD OF THE INVENTION

The present disclosure relates to equipment housings for mounting telecommunications equipment. More specifically, the disclosure relates to telecommunications equipment housings having adjustable dimension interlocking upright members and variable components.

BACKGROUND

Equipment within a telecommunications infrastructure may be maintained in variety of equipment housings. Traditionally, equipment housings have been designed with fixed dimensions for particular equipment, e.g., equipment of a particular type and/or having specific width and depth. Further mountings for equipment traditionally are incorporated into the structure of the equipment housings, e.g., mounting holes drilled into the supporting structure for equipment housing. In other words, equipment housings traditionally are designed to be static and are not intended to be modified after manufacture. However, new and different arrangements of telecommunications equipment are often required for a variety of reasons such as to handle increased demands for service, due to technology changes, to accommodate new or different equipment, and so forth. Updating static equipment housings to accommodate new equipment and/or equipment arrangements may be time consuming, costly, frustrating and even impossible.

Accordingly traditional techniques produce telecommunication housings which are inflexible, may be difficult or impossible to modify to accommodate new equipment and/or new equipment configurations, and may be more costly to manufacture or update.

SUMMARY

Improved telecommunications equipment housings are described. In an upright members for a telecommunications cabinet are described which may be joined in pairs to form an adjustable portion of the telecommunication housing. For example, a first upright member may be joined in one of a plurality of positions to form the side wall of an equipment rack. The depth of the rack may be varied by joining the upright members in different positions. In one instance, an equipment rack is formed from a plurality of identical upright members joined together. Further, the upright members may be configured to interlock, one to another.

In an implementation, variable structural members may be included to permit configuration and reconfiguration of the structural characteristics of a telecommunications equipment housing. For instance, a variety of different structural inserts may be removably embedded in a corresponding groove provided with a structural member for the telecommunication equipment housing. The shape, dimension, material and so forth of a structural insert and corresponding groove may be selected to correspond to desired structural characteristics. Thus, different inserts may be selected and embedded at different times to modify the structural characteristics of the telecommunication equipment housing.

In an implementation, a telecommunications equipment housing has removable mounting members fastened to a support structure of the equipment housing. The removable mounting members may have a variety of different mountings (e.g., different hole patterns, different fasteners, brackets and so on) to mount different types, sizes and so forth of telecommunications equipment within the housing. Various differently configured mounting members may be used in combination to permit many different mounting configurations in a telecommunications equipment housing using the same support structure. Thus, the same telecommunications equipment housing may be configured and reconfigured for a wide selection of equipment and/or arrangements of equipment.

In an implementation, a pair of identical sub-assemblies are joined to produce a variable dimensioned equipment housing. The sub-assemblies may be removably joined in a plurality of positions producing different dimensions for the corresponding equipment housing.

In an implementation, a single adjustable depth housing is configured to meet industry standard specifications designated for a plurality of separate racks having different depths. In other words, the single housing meets the specifications intended for at least two different housings having different respective depths.

BRIEF DESCRIPTION OF THE DRAWINGS

FIG. 9 is a flow diagram depicting a procedure in an exemplary implementation in which a variable width side wall of a telecommunications equipment cabinet is formed.

FIG. 10 is a flow diagram depicting a procedure in an exemplary implementation in which a structural insert is embedded in a structural member to vary characteristics of a corresponding cabinet.

FIG. 11 is a flow diagram depicting a procedure in an exemplary implementation in which removable mounting members are utilized to secure a plurality of telecommunications equipment within a cabinet.

FIG. 12 is a flow diagram depicting a procedure in an exemplary implementation in which a adjustable dimensioned equipment cabinet is formed by joining identical sub-assemblies.

DETAILED DESCRIPTION

It should be noted that the following devices are examples and may be further modified, combined and separated without departing from the spirit and scope thereof.

Exemplary Environment

Figure 1:
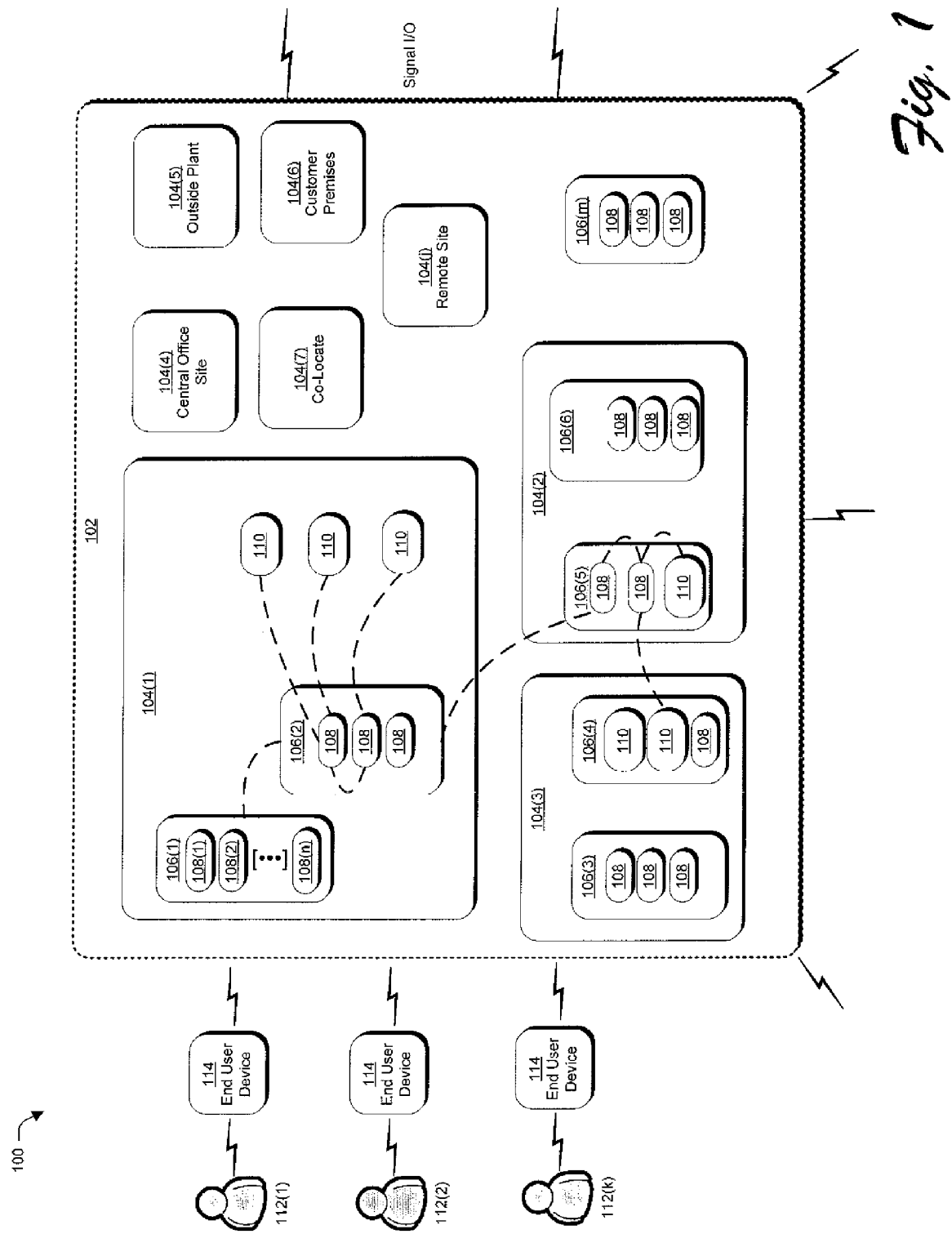
FIG. 1 is an illustration of an environment having a portion of a telecommunications infrastructure in which telecommunications equipment housings may be employed.

FIG. 1 illustrates an exemplary implementation of an environment 100 operable to provide a telecommunications network in which the apparatuses and procedures of the present disclosure may be employed. The environment 100 includes at least a portion of a telecommunication network infrastructure 102 (hereinafter "infrastructure"). Infrastructure 102 provides telecommunications processes, structures, equipment and devices between end-user devices such as modems, phones, and so on used by end-users outside of the infrastructure 102 to communicate via a telecommunications network. Within infrastructure 102 a variety of equipment, apparatus and devices are utilized in routing, processing, and distributing signals. Telecommunications signals and data may among other actions be processed, switched, routed, tested, patched, managed, or distributed by various equipment in the infrastructure 102.

A variety of sites 104(1)-104(j) within infrastructure 102 may maintain various equipment used in the infrastructure 102, where "j" may be any integer from one to "J". As depicted in FIG. 1, infrastructure 102 may have numerous sites 104 which may be different physical locations within infrastructure 102 such as a central office, an outside plant site, a co-locate site, a remote site, or customer premises. Sites 104 may be locations within infrastructure 102 which hold a variety of structures and equipment to facilitate processing and distributing of telecommunications signals. The equipment may be centralized in one site (e.g., site 104(1)) or dispersed throughout different sites 104 in infrastructure 102. In other words, interconnections may be made between various sites 104 in infrastructure 102, for example the connection denoted in FIG. 1 by a dashed line between site 104(1) and 104(2). Naturally, numerous interconnections between a plurality of sites 104 typically may be made.

Each site 104 may have one or more housings 106 having a plurality of components 108. A plurality of housings 106 (1)-106(m) are depicted in FIG. 1, where "m" may be any integer from two to "M". A housing refers to a structure to maintain or hold a plurality of components 108 in infrastructure 102 and may be configured in a variety of ways. For example, the housing 106 may be configured as a housing for a cabinet, a terminal block, a panel, a protector block, a chassis, a digital cross connect, a switch, a hub, a rack, a frame, a bay, a module, an enclosure, an aisle, or other structure for receiving and holding a plurality of components 108. Hereinafter, the terms housing and cabinet will be used for convenience to refer to the variety of structures in infrastructure 102 that may hold components 108. Housings 106 may be inside a building or housings may themselves be configured to be placed outside, e.g. an outside plant cabinet. Housings 106 may typically be configured to protect components 108 from environmental influences. The environment 100 of FIG. 1, for instance, depicts site 104(1) as having two housings (e.g., cabinets) 106, each having a plurality of components 108. Other housings 106 may be included throughout infrastructure 102 at sites 104, for example housings 106 depicted within site 104(2).

Components 108 are pieces of telecommunications equipment in infrastructure 102 that may be kept or maintained in a housing 106 (e.g., a cabinet) within the infrastructure 102. Components for example may be cross-connect panels, modules, terminal blocks, protector blocks, chassis, backplanes, switches, digital radios, repeaters and so forth. Generally, components 108 may be those devices utilized for processing and distributing signals in infrastructure 102 and which may be maintained in a housing 104. Components 108 may also be used to manage cabling in infrastructure 102. Components 108 may terminate, interconnect or cross-connect a plurality of network elements 110 within infrastructure 102. Components 108 may be utilized to distribute telecommunications signals sent to and from infrastructure 102 by one or more end-users 112 using an end-user device 114. The interconnections between telecommunications equipment (e.g., cabinets 106, components 108 and network elements 110) provide signal pathways for telecommunications signals. Interconnection may be via one or more components 108 such as by connectors disposed on a component, such as a protector block, or may be internal to the components 108 such as via cabling within a component 108. Representative interconnections are shown by dashed lines in FIG. 1 and numerous interconnections within and between telecommunication equipment are typical.

Network elements 110 may be implemented in a variety of ways. For example, network elements 110 may be configured as switches, digital cross connect system (DCS), telecommunication panels, terminal blocks, protector blocks, digital radios, fiber optic equipment, network office terminating equipment, and any other telecommunication equipment or devices employed in a telecommunications infrastructure 102. It is noted that one or more of the components 108 within a cabinet 106 may also be a network element 110. In other words, network elements 110 may be found within a cabinet 106 as component 108 of the cabinet. Thus, in a particular cabinet 106 interconnections may be between network elements 110 externally (e.g., not in the same cabinet) or internally (e.g., within the same cabinet). Naturally, internal and external interconnections may be mixed such that a single cabinet 106 will have both internal and external interconnections. Further, such connections for a particular cabinet 106 might be made wholly within a particular site 104. Interconnections may also be made between a plurality of sites 104 (1)-104(j).

In an implementation, a cabinet 106 has a plurality of components 108 to connect numerous lines. A cabinet 106 may have a plurality of components 108 as depicted in FIG. 1 by 108(1), 108(2), ..., 108(n), where "n" may be any integer from one to "N". Components 108(1)-108(n) generally provide modular connection points within a cabinet 106 between various network elements 110 such as switches, cross-connects, terminal blocks, protector blocks and so forth. End-users 112 may be connected via twisted pair cabling to protector blocks 108(1)-108(n) in a cabinet 106 located within infrastructure 102. Further, end-users 112 may be connected via a plurality of network elements 110 which are connected via the various equipment in infrastructure 102, including the interconnections of a plurality of protector blocks such as protector blocks 108(1)-108(n). For example, an end-user telephone call made between end user 112(1) and end user 112(2) may be routed using one or more protector blocks 108(1)-108(n) and/or various network elements 110 within infrastructure 102.

The environment 100 depicts a plurality of end users 112 (1)-112(k), where "k" may be any integer from one to "K". End users 112(1)-112(k) may be communicatively coupled, one to another, via a telecommunication network including infrastructure 102. End users 112 may be implemented in a wide variety of ways, such as consumers, business users, internal users in a private network, and other types of users that use telecommunications signals or transmit and receive telecommunications signals. Additionally, for purposes of the following discussion clients 112(1)-112(k) may also refer to client devices and software which are operable to transmit and receive telecommunications signals. Thus, clients 112 (1)-112(k) may be implemented as users, software and devices.

The interconnection of pieces of equipment (e.g. cabinets 106, components 108 and network elements 110, and so forth) provides signal pathways between equipment for signals input to and output from infrastructure 102. For example, end-users 112(1)-112(k) may send signals into the infrastructure 102 and receive signals output from the infrastructure using a variety of end user devices 114. For example, end user 112(2) may communicate with end user 112(k) via end-user device 114 (e.g., a telephone). Thus, signals sent to and from infrastructure by end-users 112 via an end user device 114, may be routed directed, processed, and distributed in a variety of ways via the equipment and interconnections within infrastructure 102.

In an implementation, one or more cabinets 106(1)-106(m) may be configured as equipment racks. An equipment rack provides mountings for a plurality of components 108(1)-108(n). Generally, a rack refers to cabinet 106 configured with an open frame housing as opposed to an enclosure with doors and so forth. As will become apparent in the following discussion a cabinet 106 configured as a rack may be provided with one or more variable features including, interlocking upright members, variable dimensions, removable mounting members, and/or insertable structural members. In this manner, a cabinet 106 may be configured and reconfigured for a variety of applications within a telecommunications infrastructure. Thus, reconfiguration of telecommunication infrastructure may be accomplished without requiring a new rack, without redesigning existing housing structures and so forth.

In the following discussion features which may be incorporated into a telecommunications equipment cabinet design will be described followed by an exemplary description of a cabinet. While cabinets 106 configured as racks have been described, it should be appreciated that the devices and techniques may also be applied in cabinets 106 configured for a variety of applications, such as in an enclosed cabinet 106, at outdoor site 104 and so forth. For instance, a cabinet 106 may be configured for application at an outside plant site such as site 104(5) depicted in FIG. 1. In other words, the cabinet 106 may be an outside plant cabinet. An outside plant cabinet, as the name suggests, is located outside and is configured to protect a plurality of components 108, from environmental influences (e.g., heat, cold, wind, rain and so forth). Thus, it is contemplated that the devices and techniques described herein may be employed with various cabinets 106(1)-106(n) configured for indoor and outdoor applications alike.

Interlocking Uprights Members

Figure 2:
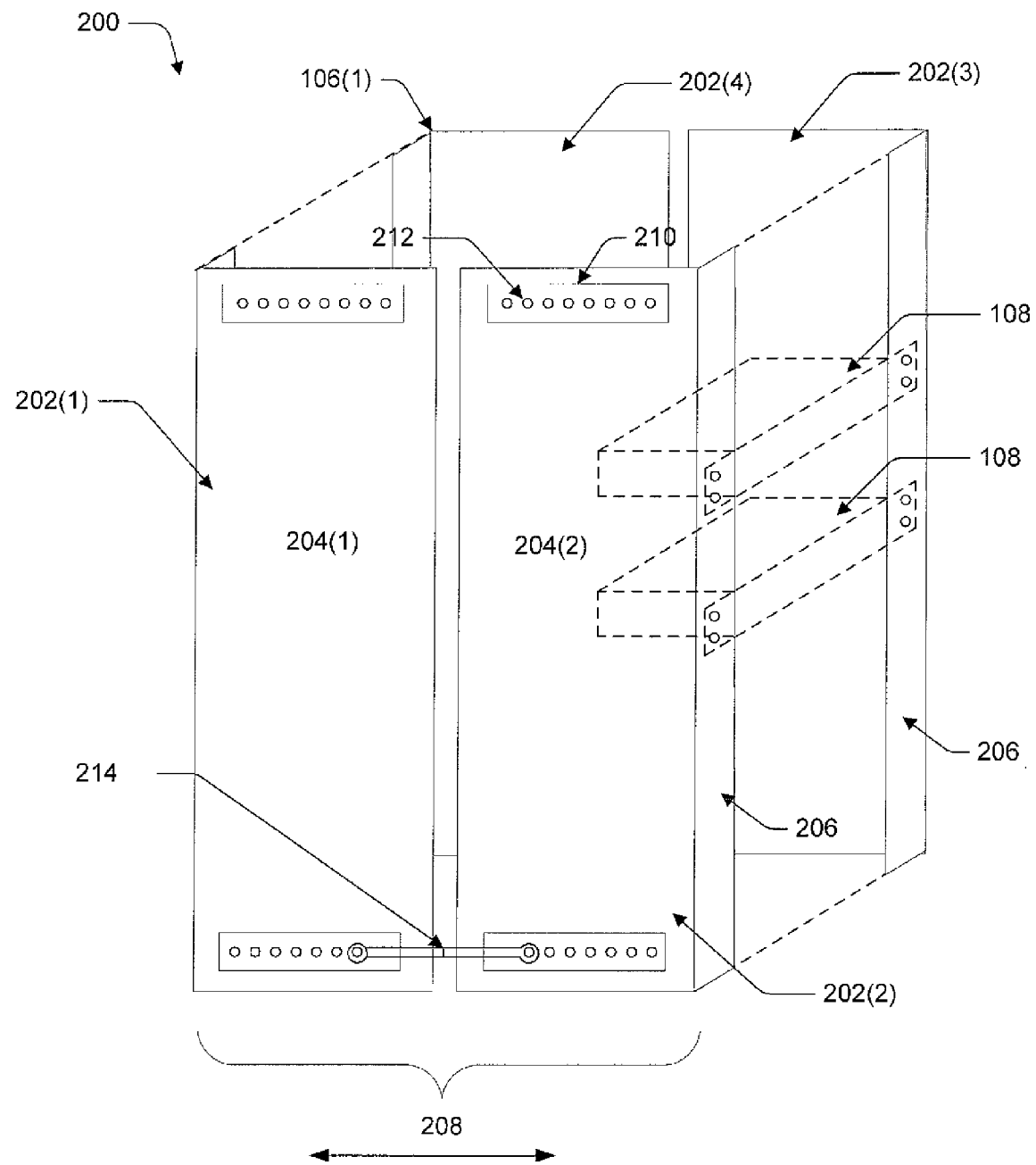
FIG. 2 illustrates an exemplary implementation of an equipment cabinet of FIG. 1 having joined upright members

FIG. 2 illustrates an exemplary implementation 200 of one or more of the cabinets 106(1)-106(n) of FIG. 1. An exemplary cabinet 106(1) configured to hold a plurality of telecommunications components 108 is depicted in FIG. 1. Generally, a cabinet 106(1) has a rectangular solid shape such as a block or cube, as in FIG. 2. The cabinet 106(1) as previously described may be an open rack, an enclosure and so forth. It should be appreciated that a cabinet 106(1) may be formed utilizing a plurality of structural members that are joined in a variety of ways. For instance, the structure of a cabinet 106 may include a plurality of upright members 202 which are joined together to form the open structure of the rack.

Cabinet 106(1), for example, is depicted as formed via upright members 202(1)-202(4). Upright members 202 may be configured in a variety of ways such as corner posts, metal tubes, sheet metal panels, angled rails and so forth. Upright members 202 are generally structural supporting members for a cabinet 106 and equipment maintained within the cabinet, e.g., components 108, network elements and so forth. Optionally, panels, doors and so forth may be added to the rack structure to form an enclosed cabinet 106(1). Further discussion of a cabinet 106 formed via a plurality of upright members may be found in relation to FIGS. 7-8

In this instance, a portion of a cabinet 106(1), such as a side wall, is formed utilizing at least two joined upright members 202. As will be described in greater detail below, the upright members 202 may be joined in a variety of positions to form a variable-dimensioned cabinet 106 configured to mount a variety of telecommunications equipment. A pair of upright members 202 may be joined to form a side wall of cabinet 106(1), such as by joining exemplary upright members 202(1), 202(2) depicted in FIG. 2. Upright members 202(2) and 202(2) are each depicted with a respective side surface 204(1) and 204(2). The side surfaces 204(1), 204(2) thus form the side wall of cabinet 106(1) when the upright members 202(1) and 202(2) are joined, one to another.

In an implementation, upright members 202 may each have an adjoining mounting surface 206. Mounting surface 206 is formed at a substantially right angle to the respective side surface 204. Thus, the four upright members 202 of FIG. 2 form a cabinet 106(1) with a generally rectangular cross section. In other words, the interior area of cabinet 106(1), bounded by the upright members 202, has a rectangular shape. The mounting surface 206 may be a separate piece joined to the upright members 202 through welds, glues, rivets, screws or other fastening mechanisms. Alternatively, a one piece angled upright member 202 may be formed, such as by stamping out a single piece flat panel and bending the panel to form an upright member 202, with side surfaces 204 and mounting surfaces 206 at right angles to one another. In an implementation, the side surfaces 204 and corresponding mounting surfaces 206 joined to the side surfaces form the corners of a cabinet such as cabinet 106(1).

As previously described a cabinet 106 may maintain or hold a plurality of components 108 in infrastructure 102. For instance, the plurality of mounting surfaces 206 of cabinet 106(1) may be configured to provide a plurality of mountings for a variety of components 108. The plurality of mountings may configured in a variety of ways, including a variety of fasteners, mounting holes arranged in various patterns, different sized mounting holes, brackets and so forth. A plurality of telecommunications components 108 are depicted in phantom in FIG. 2 as mountable within cabinet 106(1) via the respective mounting surfaces 206 of upright members 204(2) and 204(3). In an implementation, variable mounting members may be provided on the mounting surfaces 206 to permit configuring and reconfiguring of a cabinet 106(1) to mount a variety of different equipment. Further discussion of cabinet mountings and variable mounting members may be found in relation to FIG. 6.

In an implementation, the upright members 202 of cabinet 106(1) are further configured to be joined such that at least one dimension of the cabinet 106(1) is variable, e.g. one or more of the depth, width, or height of the cabinet may be variable. For example, FIG. 2 depicts a cabinet having a variable depth 208. A pair of upright members 202, for instance, are joinable in a variety of ways to provide the variable depth 208. For instance, securing mechanisms 210 are depicted in FIG. 2 as disposed on upright members 202(1) and 202(2). A plurality of positions 212 are associable with securing mechanisms 210. Thus, upright members 202(1) and 202(2) may be joined in different arrangements corresponding to different respective positions 212, thereby forming a cabinet 106(1) of variable depth. Securing mechanisms 210 on respective upright members 202 may be utilized to join the upright members 202 in a variety of ways, such as through the use of various fasteners, extensions, or interlocking designs.

In an implementation, securing mechanisms 210 on respective upright members 202 are configured to mate directly, thereby joining the upright members 202 in a "closed position", e.g., such that the side surfaces 204 of the respective upright members 202 overlap. Generally any removable securing mechanisms 210 may be employed in the previously described techniques. For instance, a pair of upright members 202 may be joined by ordinary fasteners such as screws, pins, clips, latches, and so forth.

As an example, securing mechanisms 210 on each of the upright members 202(1) and 202(2) may include positions 212 configured as a plurality of apertures for a pin. The upright members 202(1), 202(2) may be aligned such that respective side surfaces 204(1), 204(2) overlap and respective pin apertures are lined up. Then, one or more pins may be used to secure the upright members 202(1), 202(2) at the corresponding position 212, such as by passing a pin through the aligned pin apertures. It should be appreciated that the upright members 202(1), 202(2) may be joined in numerous positions 212 resulting in a variety of depths 208 for the corresponding cabinet 106(1).

In an implementation two upright members 202 are fastened in an "open position", e.g., with a gap between the side surfaces 204. In this implementation, an extension 214 may be used to join the respective uprights. The extension 214 is configurable in a variety of ways (e.g., a bar, a rod, a plate, and so forth) which bridges the gap between respective upright members 202(1), 202(2) and connects on either side to respective securing mechanisms 210. An extension 214 may be configured to connect to one or more securing mechanism 210 on each upright member to be joined. Thus, the extension 214 may permit an even greater range of depths 208, in which, the cabinet 106(1) may be configured. Further, discussion of open and closed position fastening may be found in relation to FIG. 3.

In an implementation, interlocking securing mechanisms 210 may be used in lieu of or in conjunction with ordinary fasteners. Interlocking may be accomplished by providing corresponding protrusions and indentations which mate to join the respective upright members 202(1), 202(2). For instance, a ridge, pin, knob, tab, clip, hook, barb, bar or other protrusion included with securing mechanism 210 of upright member 202(1) may engage a corresponding notch, hole, slot, groove or other indentation provided with securing mechanism 210 of upright member 202(2). Naturally, protrusions and/or indentations may be arranged on either one of upright members 202(1), 202(2). In addition, protrusions and indentations may be combined such that both protrusions and indentations are found on each side of the attachment (e.g., protrusions and indentations included on both upright members 202).

In an implementation, a plurality of the upright members 202 forming the cabinet 106 are identical. For example, in the implementation depicted in FIG. 2, upright member 202(1) may be joined to upright member 202(2), which in this instance is identical to upright member 202(1). In FIG. 2, upright member 202(2) is rotated 180 degrees in the drawing plane relative to upright member 202(1). Upright members 202(3) and 202(4), which may be similarly joined, are also identical to one another and are orientated 180 degrees in rotation from each other, respectively. Further, all four uprights members 202(1)-202(4) of cabinet 106(1) depicted in FIG. 2 may be identical. Thus, the cabinet 106(1) may include sidewalls formed from joined pairs of identical upright members 202. Using identical upright members 202 joined in pairs to form the cabinet simplifies manufacture, requires fewer parts, reduces costs and results in reduced complexity when being assembled.

Although generally removable fastening techniques have been described which are employed to permit flexibility, fixed fastening such as welds, glue and so forth may also be used. For instance, a customer may desire (and even in certain applications require) fixed fastening in one or more dimensions, such as for added stability, to meet specifications, and so forth. Manufacture of variable dimensioned cabinets 106 using common parts (e.g. identical uprights 202) with fixed fastening maintains the advantages of lower cost and increased manufacturing efficiency.

Thus, structural upright members 202 described may be used to form cabinets 106 of varying depth 208. Naturally, the techniques described herein may also be applied to vary the height and/or width of a cabinet 106, alone or in addition to the depth 208, (e.g., by rotating the cabinet 106(1) depicted in FIG. 2 and/or by rearranging the mounting surfaces 206.) Thus, individual cabinets 106 may be manufactured with fixed dimensions to accommodate equipment of different sizes (e.g. different depth, width, height and so forth) using common parts. This reduces cost and increases manufacturing efficiency. Further, a particular cabinet 106(1) may be manufactured with variable dimensions, thus the cabinet 106(1) may be reconfigured "in the field" to hold different sized equipment. This provides flexibility and permits a customer and/or a technician to make new arrangements of components 108 within telecommunications infrastructure 102 without the frustration and/or expense of having to replace an entire cabinet.

FIGS. 3A-3C illustrate an exemplary implementation 300 of interlocking upright rack members of one or more of cabinets 106(1)-106(m) of FIG. 1. Reference will now be made to FIG. 3A, in which, two upright members 302(1) and 302(2) are depicted in an "open position". In this implementation, the upright members 302 each include securing mechanisms 304. Securing mechanisms 304 may be utilized to join the two upright members 302(1), 302(2) together in a variety of ways, such as those previously described in relation to FIG. 2 (e.g., fasteners, interlocking and so forth). Upright members 302(1), 302(2) may be joined in the "open position" to form a portion of a cabinet 106. It is noted that upright members 302(1), 302(2) may be identical. Thus, a surface or wall of a cabinet 106 may be formed by joining identically configured upright members 302 in 180 degree rotational orientation relative to one another, as previously described in relation to FIG. 2

In this implementation, each upright 302 also includes a slot 306 which permits an upright member 302 to be interlocked in a "closed position" with another upright member. In particular, a respective slot 306 divides each of uprights 302(1), 302(2) into first areas 308(1), 308(2) and second areas 310(1), 310(2). Further each upright 302 has a respective mounting surface 312 arranged at right angles to (e.g., perpendicular to) the areas 308, 310. The upright members 302(1), 302(2) may be joined, one to another, such that the areas 308, 310 engage in an interlocking, alternating pattern.

Referring to FIG. 3B for example, upright members 302(1), 302(2) are depicted in a partially closed position. The respective slots 306 are depicted in FIG. 3B as having mated or engaged to create an interlocking overlap of the upright members 302(1), 302(2). when the respective slots 306 engage, for instance, area 308(2) passes "in front" of area 310(1) in the upper portion of FIG. 3B. Similarly area 308(1) passes in front of area 310(2) in the lower portion of FIG. 3B.

In addition, securing mechanisms 304 may be used to hold the uprights in a particular position.

Referring now to FIG. 3C, upright members 302(1), 302(2) are depicted in a fully closed position. Naturally, upright members 302 may be joined in a variety of open and closed positions via securing mechanisms 304 and or slots 306. Thus, the interlocking upright members 302 depicted in FIGS. 3A-3C may form a variety of cabinets 106 having different and/or variable dimensions.

In an implementation, each upright member 302 includes a "joggle". A "joggle" refers to an offset of the areas 308, 310 of a particular upright member 302. For instance, the offset may correspond to the material thickness of the upright member 302. For example, upright 302(1) may have area 310(1) set back (e.g., into the drawing sheet) a material thickness relative to area 308(1). This "joggle" along with the interlocking pattern of the areas ensures that respective mounting surfaces 312 of joined uprights 302 will be aligned properly. Identical uprights joined without a joggle may experience an offset of the mounting surfaces 312 due to the overlap of the respective surfaces. Therefore, the included "joggle" compensates for this offset. In this manner, identical uprights 302 may be interlocked and fastened without producing a material thickness offset of respective mounting surfaces 312.

Each of FIGS. 3A-3C depicts upright members 302 having inset portion or groove 318 which is configured to receive a structural insert. A groove 318 may be configured in a variety of ways to receive a variety of structural inserts. In this manner the structural members of a cabinet 106 may be varied such that the structural features of the cabinet 106 may be arranged and rearranged. Further discussion of variable structural members may be found in relation to the following discussion of FIGS. 4 and 5.

Variable Structural Members

Traditionally, the structural features of a cabinet 106 are fixed when the cabinet is manufactured, which prevents a technician or user from modifying the structural features. Embedded structural components are described which permit modification of the structural characteristics of a cabinet 106 such as at the time of manufacture or by a technician or user "in the field".

Figure 3:
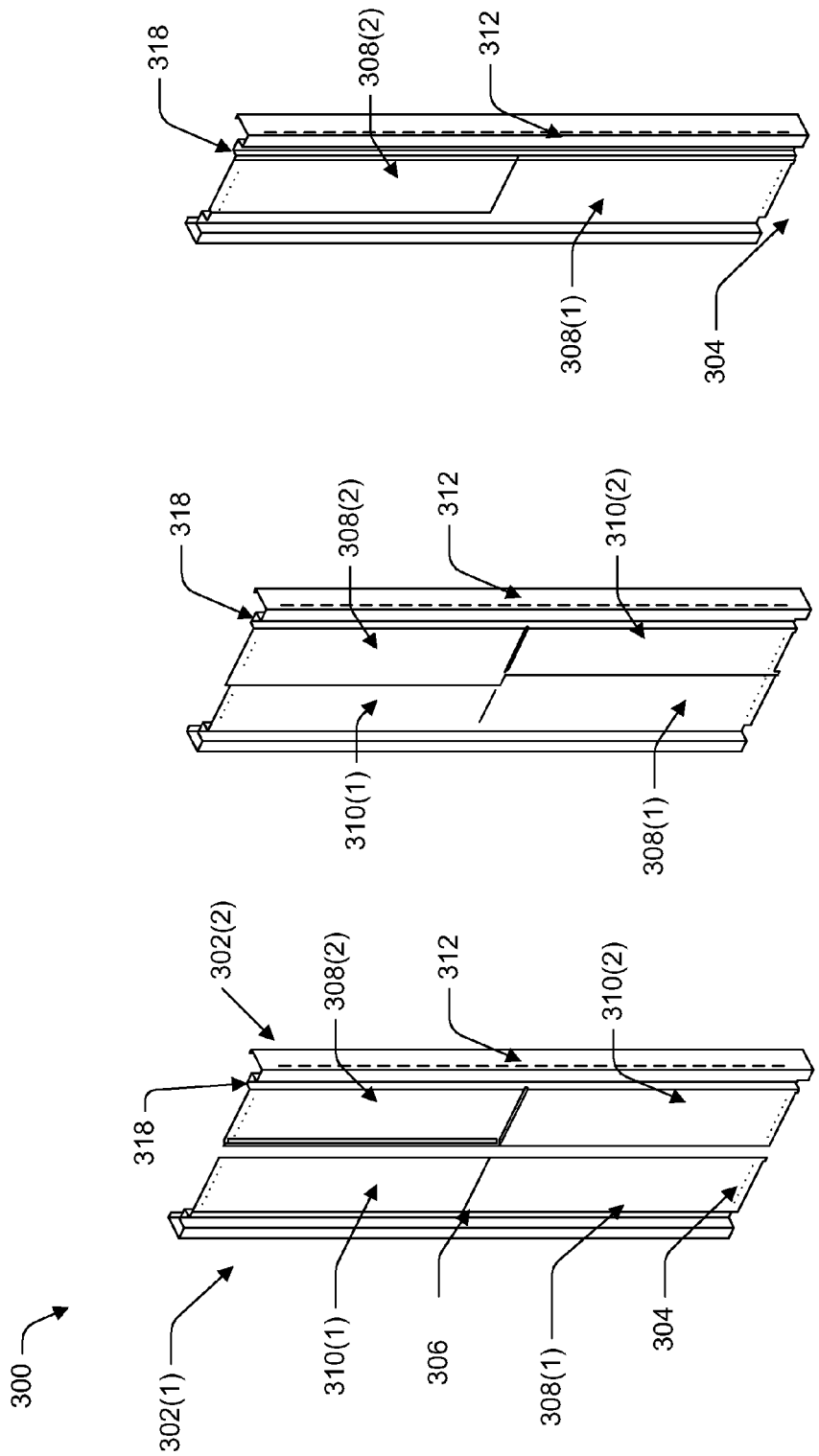
FIGS. 3A to 3C illustrate an exemplary implementation of interlocking upright rack members which may be utilized with one or more of the equipment cabinets of FIG. 1
Figure 4:
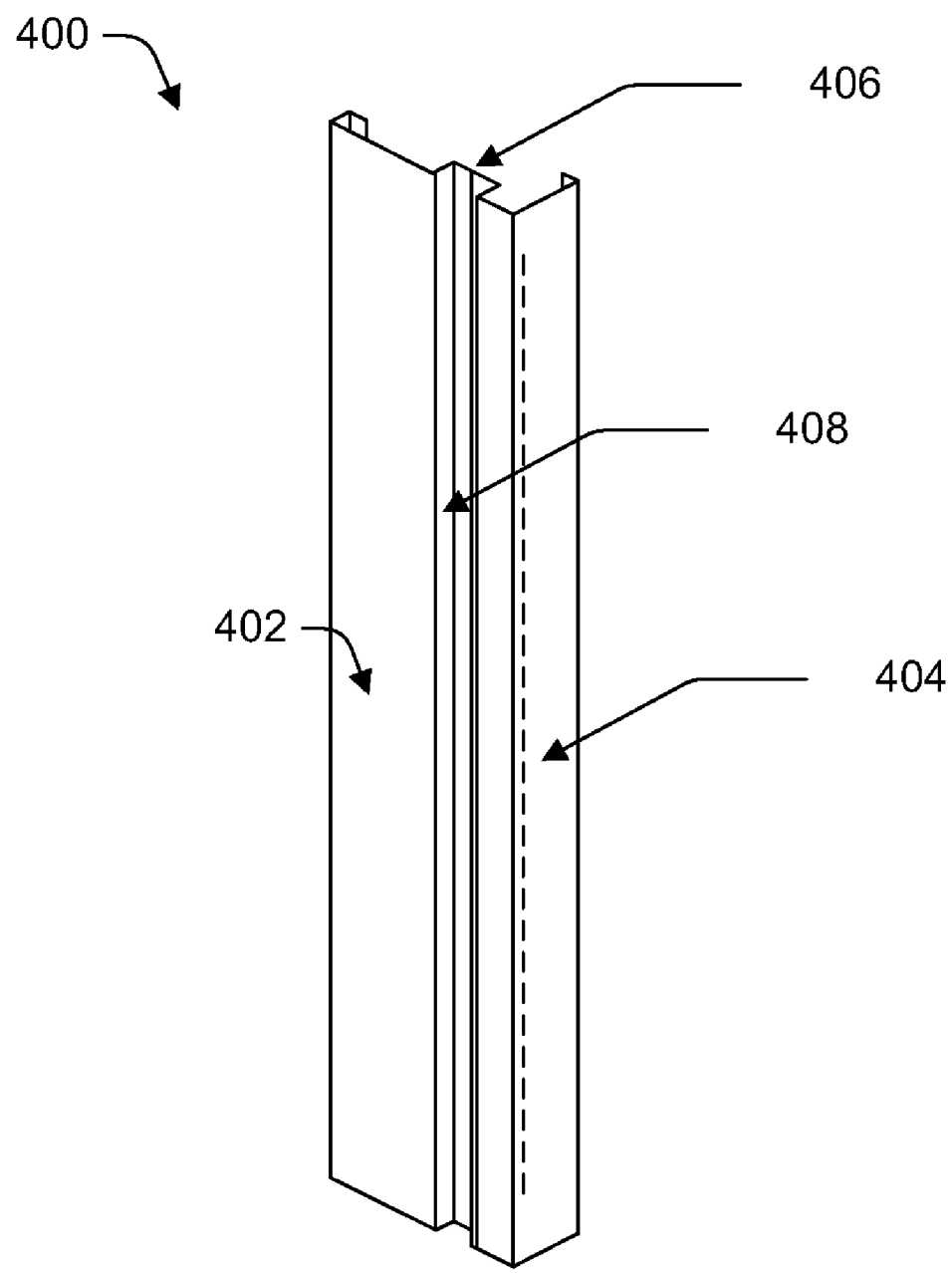
FIG. 4 illustrates an exemplary implementation of a variable structural member which may be utilized with one or more of the equipment cabinets of FIG. 1

FIG. 4 depicts an exemplary implementation of a variable structural member 400 configured to receive a structural insert which may be utilized with one or more of cabinets 106(1)-106(m) of FIG. 1. The variable structural member 400 is configurable in a variety of ways, such as a post, a panel, an upright, an angled corner member, a mounting member, and so forth, which forms a portion of a cabinet 106. For example, the variable structural member 400 may be configured as an upright member 202 or 302 as depicted in FIGS. 2 and 3A, respectively, or another component member of a cabinet 106, e.g., a panel or mounting member. The variable structural member 400 may include one or more surfaces to mount equipment, provide devices to route cabling, and so forth, such as surfaces 402, 404 depicted in FIG. 4.

Variable structural member 400 also includes an inset portion (e.g., a groove 406) configured to receive a structural insert 408. In this manner, the structural insert 408 may be embedded into the variable structural member 400. The profile of the variable structural member 400 is also configured to form around a corresponding the structural insert 408 via the groove 406. Generally, the groove 406 is configured to correspond to one or more structural inserts 408. Structural inserts 408 and corresponding grooves 406 may be configured in a variety of ways. For instance, the groove 406 may be rectangular, circular, square, u-shaped, l-shaped, semi-circular, circular, and so forth. Therefore, the structural inserts 408 are configured accordingly to correspond to the shape of one or more grooves 406. In the instance depicted in FIG. 4, the groove 406 is configured in a "U-shape" to receive a corresponding insert 408 configured as a "U-shaped" angled insert. A variety of other arrangements are contemplated further discussion of which may be found in relation to FIG. 5.

Structural inserts 408 may be utilized to arrange and rearrange the structural characteristics of a cabinet 106. For instance, structural inserts 408 may be configured as a variety of types, such as tubular, u-shaped, unistrut and so on. In addition, a variety of materials may be used for structural inserts 408 such as various metal, plastic, rubber and so forth. Thus, the type and material of an insert 408 may be selected and/or later modified to achieve desired structural properties for the cabinet 106. For instance, the rigidity, stability, dampening, strength, elasticity and so on may be modified by various combinations of types and materials.

It is noted that while a single groove 406 is depicted in FIG. 4, a plurality of grooves 406 may be included on a single variable structural member 400. In addition, the groove 406 may extend vertically or horizontally across the entire variable structural member 400 as depicted in FIG. 4, may extend partially across, and so on. Additionally, a single cabinet or a single structural member may be configured with a plurality of grooves 406 to receive the same or different types of structural inserts. For instance, a first groove 406 on structural member may be configured to receive a unshaped insert 408 and a second groove 406 may be configured to receive a tubular insert 408. Further, a single structural insert 408 may be configured for insertion into many different grooves. In other words the structural insert 408 may be interchanged between grooves, between cabinets and so on. Thus, a plurality of grooves 406 may be arranged on a variable structural member 400 in a variety of ways to permit modification of structural characteristics of a corresponding cabinet 102, e.g., grooves 406 arranged in an array or pattern across a surface 402 of structural member 400.

In an implementation, the structural insert 408 is embedded entirely into the structural member 400. In other words, the structural insert 408 does not extend past "flush" with surface 402. In this manner, the structural insert 408 does not interfere with functions performed via surface 402, such as mounting of equipment, routing of cabling, arranging of a cabinet 106 along side another cabinet(s) in a row at a site 104, and so on.

Thus, embedded structural inserts 408 may be incorporated, removed and interchanged within cabinets 106 without having to change the entire cabinet assembly. Further, embedded structural inserts 408 may be applied to the interlocking and/or variable uprights, previously described. As previously described, upright members 302 in FIGS. 3A-3C, for instance, may include respective grooves 318 to receive a structural insert 408. Naturally, structural inserts 408 may be employed with other structural members, components and so forth of the variety of cabinet 106(1)-106(m) in telecommunications environment 102 of FIG. 1.

Figure 5A:
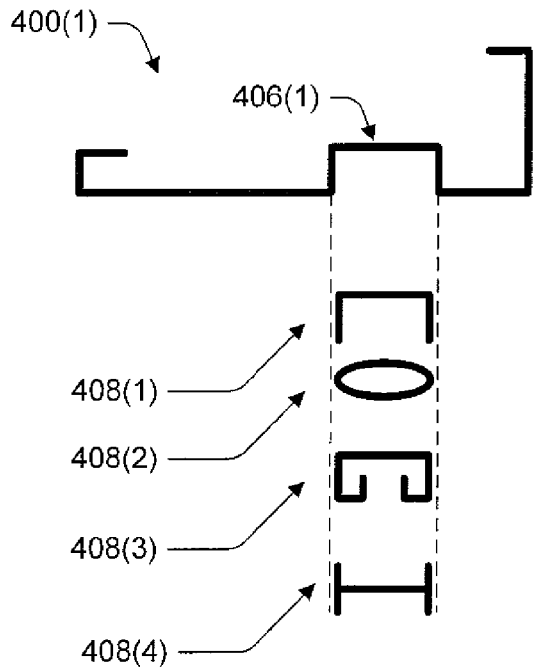
FIG. 5A-5C depict a variety of exemplary implementations for the variable structural member of FIG. 4 along with exemplary depiction of corresponding structural inserts.
Figure 5B:
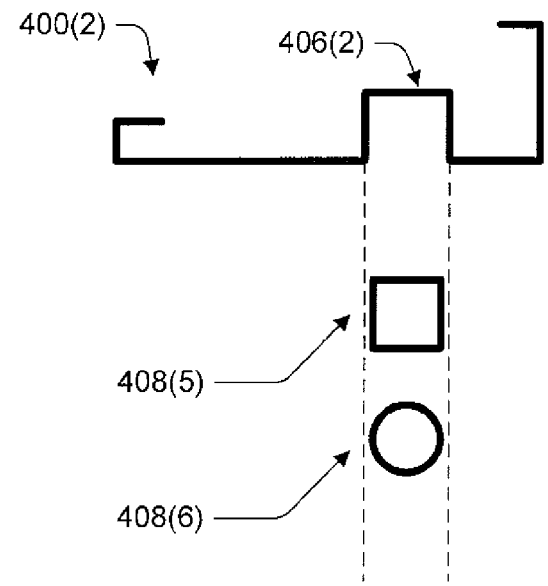
Figure 5C:
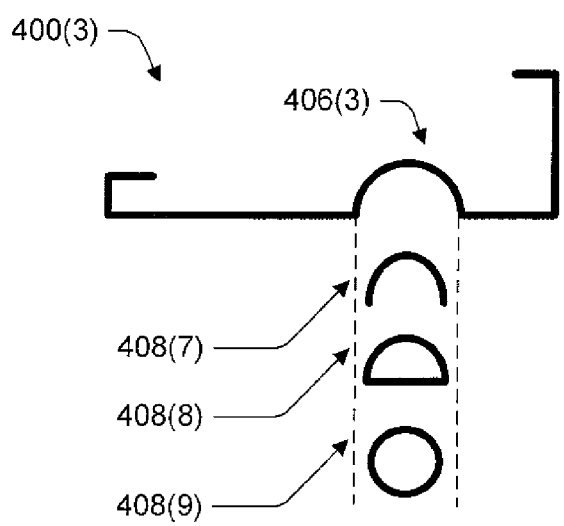

FIGS. 5A-5C depict cross-sectional views of various embodiments 400(1)-400(3) of a variable structural member depicted in FIG. 4 along with exemplary corresponding structural inserts 408(1)-408(9).

FIG. 5A depicts an embodiment of variable structural member 400(1) with a groove 406(1) configured as a rectangular "U-shape". Exemplary structural inserts 408 are depicted configured as a "U-shaped" angle 408(1), an oval tube 408(2), a unistrut 408(3) and an I-beam 408(4).

FIG. 5B depicts an embodiment of variable structural member 400(2) with a groove 406(2) configured as a square "U-shape". In this instance, the structural inserts are configured as tubes, e.g., square tube 408(5) and a circular tube 408(6). Naturally, a variety of other shapes for tubes may be used, such as rectangular, polygonal and so on.

FIG. 5C depicts an embodiment of variable structural member 400(3) with a groove 406(3) configured as a semicircle. In this instance, the structural inserts depicted are configured as an arc 408(7), a semi-circle tube 408(8) and a circular tube 408(9). Of course, a single structural insert 408 may be used along with differently configured grooves 406. For example, the circular tube 408(9) may be used with both the semi-circle groove 406(3) of FIG. 5C and the square u-shape groove 406(2) of FIG. 5B. In addition, a variety of other embodiments not depicted are contemplated, e.g., a rectangular tube used in the groove embodiments 406(1), 406(2) of respective FIGS. 5A and 5B. Further, grooves 406 may be configured in a variety of other ways for example, "V-shaped", polygonal, enclosed tubes, and so on.

In an implementation that the structural inserts 408 provide a plurality of mounting positions for telecommunications equipment, cable routing devices and so forth. For instance, an embedded unistrut 408(3) permits mounting at any position on the length of the unistrut, e.g., via corresponding unistrut fastener such as washers, brackets and so on. Alternatively, fasteners, mounting holes, brackets and so on may be disposed in a variety of patterns on a structural insert 408 for additional equipment mounting. Additional mounting provided by structural inserts 408 may be particular useful in an implementation in which structural inserts 408 are entirely embedded, e.g., do not extend past flush with surface 402. In this manner equipment may be mounted along the embedding surface 402 without interference from a protruding structural insert 408.

Variable Mounting Member

Traditionally, the mounting features of a cabinet 106 are integrated as part of the supporting structure for the cabinet 106. For instance, mounting hole patterns for mounting of telecommunication components 108 in a cabinet 106 have traditionally been formed as part of the structure of the cabinet, e.g. integrated on an exterior surface of the structure. Thus, the mounting patterns, materials, and so on for the mounting features are practically permanent. Thus, traditional arrangements provide little or no flexibility to reconfigure a cabinet for mounting new, additional or different components 108 or for modifying the arrangement of components. The following describes variable mounting members which are provided as separate items from the structural support of a cabinet 106, thereby permitting interchange and updating of mounting members of a cabinet to accommodate new or different equipment and/or new arrangements of equipment.

Figure 6A:
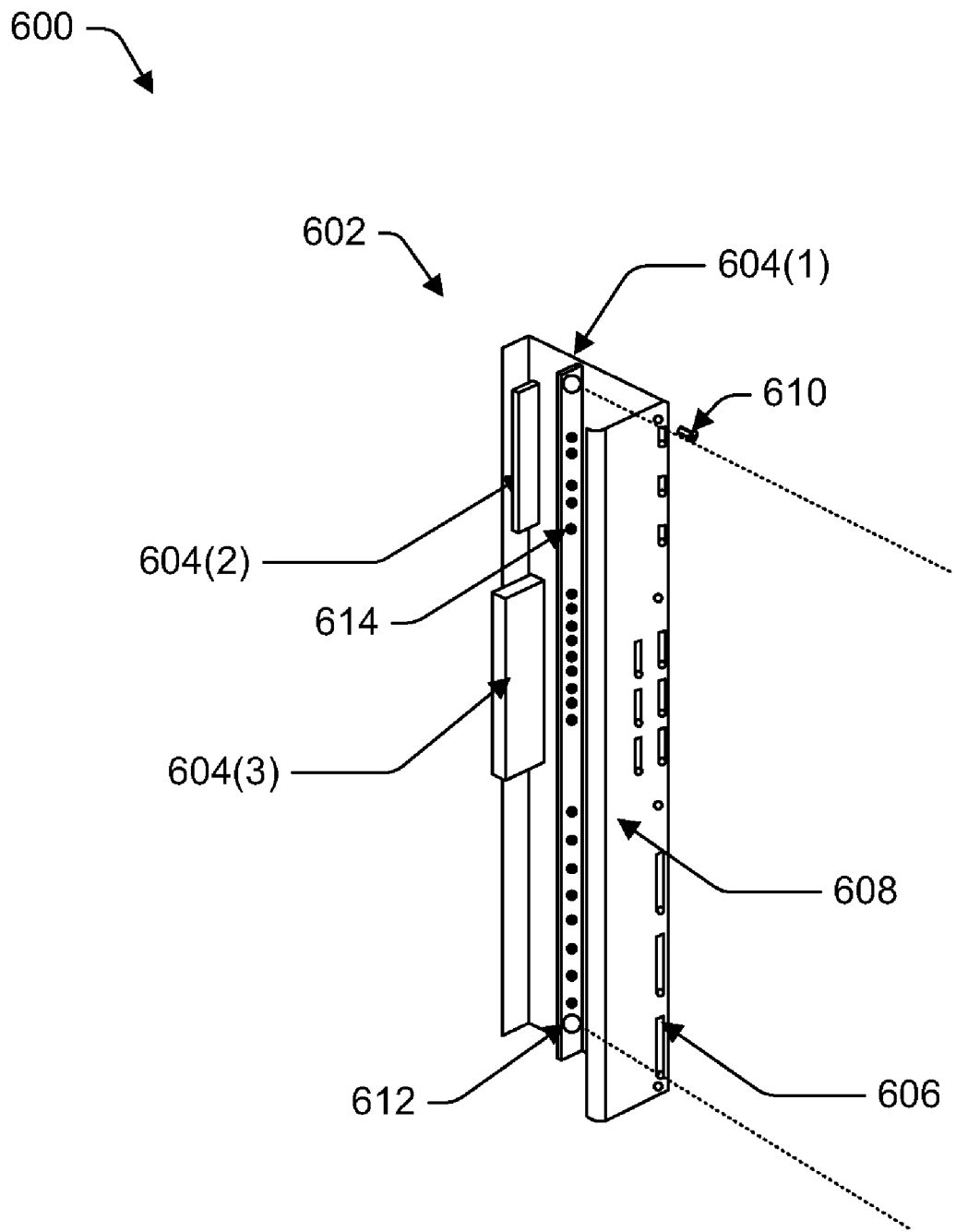
FIG. 6A illustrates an exemplary implementation of a support structure with variable mounting members which may be utilized with one or more of the equipment cabinets of FIG. 1

FIG. 6 depicts an exemplary implementation 600 of a structural support with variable mounting members which may be utilized with one or more of cabinets 106(1)-106(m) depicted in FIG. 1. A portion of the supporting structure 602 for a cabinet 106 is depicted. The supporting structure 602 is configurable in a variety of ways to form a portion of a cabinet 106. For instance, the supporting structure 602 may be a wall, a panel, a post, an upright member and so on.

FIG. 6 further illustrates a plurality of mounting members 604(1), 604(2), 604(3). Naturally, the depicted mounting members 604(1), 604(2), 604(3) are representative of a variety of differently configured mounting members 604 which may be used alone or in conjunction with on another. In an implementation, the variety of mounting members 604 are removably fastenable to the supporting structure 602 to provide variety of mounting options within a cabinet, e.g., cabinet 106(1)-106(m) of FIG. 1. For instance, a wide selection of telecommunications components 108 may be mounted within a single cabinet 106 utilizing mounting members 604 configured in a variety of ways. Different mounting members 604 may be arranged within the same cabinet or within different cabinets to mount equipment having different sizes, types, and so on. Further, the mounting members 604 are removably fastened to the supporting structure 602 of a cabinet and thus may be updated or interchanged to vary the mounting arrangements of the structure 602 and corresponding cabinet.

As depicted in FIG. 6, the support structure 602 may have a plurality of securing mechanisms 606 disposed on one or more surfaces 608 to removably fasten mounting members 604 to the support structure 602. The securing mechanisms 606 may be arranged in a variety of ways on the surface 608 of the supporting structure 602, such as different sizes, patterns, shapes, types, spacing and so forth. In this manner, variable mounting members 604 may be secured to a supporting structure in a variety of arrangements. Accordingly, a corresponding cabinet may be configured and reconfigured to accommodate different equipment and different mounting arrangements at different times.

In an instance, the securing mechanisms 606 are configured as a plurality of apertures (e.g., slots, holes, threaded holes) which may receive a variety of ordinary fasteners 610, such as bolts, screws, pins, clips and so forth. Various aperture patterns on surface 608 may be employed to permit a variety of interchangeable and removable arrangements of mounting members 604. Mounting member 604(1) is depicted with a plurality fastening mechanisms 612 which may be used in combination with securing mechanisms 606 of the support structure 602 to fasten the mounting member to the support structure 602. For example, a bolt (e.g. fastener 610) may be used with a slot (e.g. securing mechanism 606) in the support structure 602 and a corresponding bolt hole in the mounting member 604(1) to fasten the mounting member to the interior of the support structure 602. It is noted that while interior fastening of mounting members 604 is depicted, a mounting member 604 may also be fastened to the exterior surface of the support structure 602.

Alternatively, a mounting member 604 may be fastened using interlocking fastening, "snapping-in" and so forth, e.g., by corresponding mating features provided on the structure 602 and mounting member 604. For instance, fastening mechanisms 612 of a mounting member 604 may be configured to interlock with corresponding securing mechanisms 606 of the support structure. Various combinations of interlocking tabs, indentations, protrusions, slots, grooves, ridges and so forth may be used to create interlocking arrangements between mounting members and securing mechanisms. Interlocking arrangements may be used in lieu of or in conjunction with ordinary fasteners 610. Although ordinary fasteners and interlocking arrangements have been described, any removable fastening may be employed without departing from the spirit or scope thereof.

Different mounting members 604 may be configured with a variety of different characteristics, such as with different widths, lengths, thickness, materials and so on. Varying the characteristics of mounting members 604 associated with a cabinet 106 provides a great deal of flexibility, in that, a single design structure may be used for a wide selection of telecommunication equipment, e.g., components 108, network elements 110 and so on. Further, removably-fastened mounting members 604 may be interchanged between cabinets 106(1)-106(m) and updated within a particular cabinet 106, which allows for reconfiguration of the cabinet 106 with new, additional, or different equipment. Thus, mounting members 604 may be provided within the same or different cabinets 106 with different lengths, thickness, and widths The dimensions selected for a particular mounting member 604, for instance, may correspond to particular equipment selected to be mounted within a cabinet 106.

In an implementation, support structure 602 has a single removable mounting member 604. The single mounting member 604 extends the length of the support structure, e.g., mounting member 604(1). Alternatively, a plurality of shorter length mounting members 604(2), 604(3) may be used. The plurality of mounting members may be arranged to be adjoining and/or spaced apart in a variety of patterns on a surface 608. A variety of other arrangements of one or more mounting members 604 with various lengths are also contemplated.

In an implementation, the supporting structure 602 is configured with a plurality of mounting members 604 of varying dimensions to permit various sizes of components 108 to be mounted within the same cabinet 106. For instance, mounting member 604(2) is depicted in FIG. 6 as having a smaller thickness, width and length relative to mounting member 604(3). As an example, a narrower mounting member 604(2) may permit a wider component 108 to be mounted relative to the wider mounting member 604(3). Again, since the mounting members 604 are interchangeable and removable, the cabinet 106 may be initially configured with mounting members 604 of a certain size corresponding to components 108 of a particular size, and may later be reconfigured with different sized mounting members 604 corresponding to different sized components 108.

Further, mounting members 604 may be formed from a variety of materials, such as aluminum, steel, plastic, rubber and so forth. Different mounting members 604 associated with the same cabinet 106 may also be composed of different materials. For example, the upper portion of a cabinet 106 may use aluminum mounting members 604 while the lower portion uses a different material for mounting members 604, e.g., plastic or rubber. Thus, each of mounting members 604(1), 604(2), 604(3) may be optionally formed of the same or different materials.

In an implementation, mounting members 604 are configured with a variety of equipment mountings 614 arranged to allow a variety of different sizes and/or types of telecommunications components to be mounted within a corresponding cabinet 106 via the mounting member 604. For instance, equipment mountings 614 may be arranged with a variety of different types, different spacing, and/or different sizes disposed both on different mounting members 604 and/or on a single mounting member. Each of the mounting members 604(1), 604(2), 604(3) depicted in FIG. 6 has a plurality of equipment mounting 614 for various equipment within a cabinet 106. Thus, variable mounting members have been described which are removable, interchangeable and updateable within a cabinet 106 to accommodate mounting a variety of telecommunications equipment within the same cabinet 106.

Configurable Universal Telecommunications Frame (UTF)

Figure 7B:
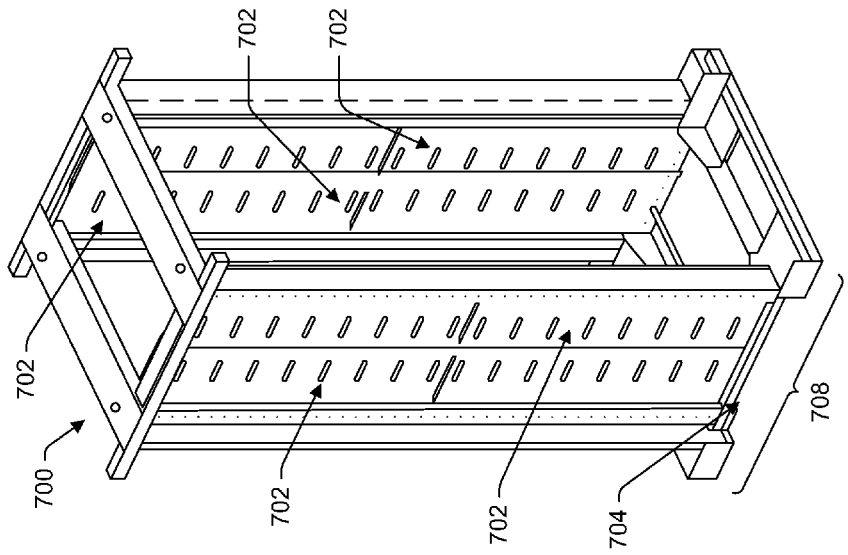
FIGS. 7A-7B illustrate an exemplary adjustable dimensioned equipment cabinet which may incorporate one or more of the features depicted in FIGS. 2-6A.
Figure 7A:
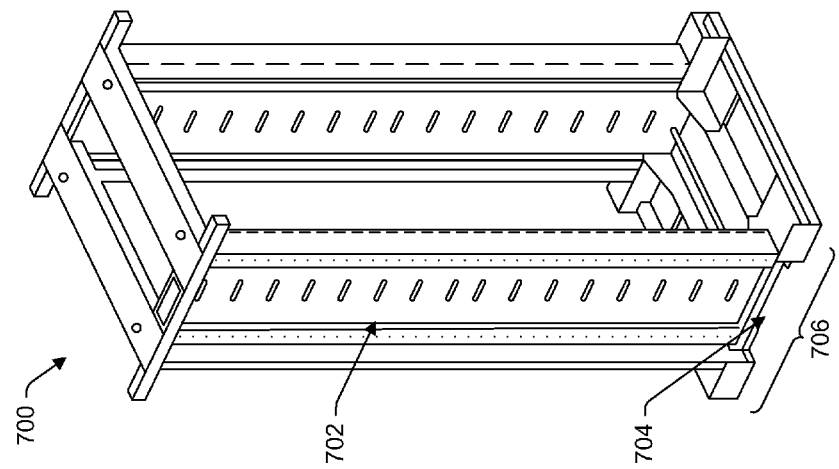

FIGS. 7A-7B depict an exemplary adjustable depth equipment cabinet which incorporates one or more of the features previously described in relation to FIGS. 2-6. The cabinet 700 of FIGS. 7A-7B is depicted as an open rack. Naturally, doors, panels and so forth may be added to produce an enclosed cabinet 700 for use in certain applications without departing from the spirit and scope thereof.

In an implementation, cabinet 700 is configured to have an adjustable depth. Cabinet 700 includes a plurality of upright members 702, which may be configured as the upright members 202 and 302 previously described in relation to FIGS. 2-3. The upright members 702 are arranged to slide between a maximum and minimum depth. A variety of fastening mechanisms 704 may be used to join or lock in to place the plurality of upright members 702 in a variety of positions corresponding to a variety of depths. Fastening mechanisms 704 may be ordinary fasteners such as screws, bolts, pins and so forth. In certain applications, a cabinet 700 may also be fixedly fastened at a particular depth such as through weld, glue, and so on. Thus, cabinets formed from the same component parts may be permanently fastened or temporarily fastened with removable hardware depending on the particular application.

Further, the plurality of upright members 702 may be configured to interlock as described in relation to FIG. 3. FIG. 7A, for instance, depicts cabinet 700 as having a minimum depth 706 in which the plurality of upright members 702 are fully interlocked. FIG. 7B depicts the same cabinet 700 at the maximum depth 708 with the upright members 702 "just" interlocking. In an implementation, the cabinet 700 is configured to be locked into position at a plurality of incremental depths between the minimum depth 706 and maximum depth 708.

In an implementation, each of the uprights 702 forming cabinet 700 are identical. For example, "left-handed" and "right-handed" versions of uprights 702 are not provided as is typically the case for traditional equipment racks. Rather, as is best seen in FIG. 7B, four identical uprights 702 are used to form cabinet 700. Thus, the manufacturing and assembly of cabinet 700 is simplified and less costly when compared to traditional cabinets.

In an implementation, cabinet 700 is configured as an electronic equipment universal telecom framework (UTF) designed for bracing against earthquake damage. American National Standard Institute (ANSI) standard T1.336, establishes dimensional parameters, performance requirements, and application criteria for the manufacture and availability of frames used to house electronic equipment in telecom facilities. In particular, ANSI T1.336 is intended to establish a set of common dimensional footprints for universal telecommunications (UTF) frameworks, provide stronger frames for handling larger, heavier equipment, and to establish design parameters for developing future telecommunications equipment. ANSI standard T1.336 for instance specifies load characteristics, standard sizes for footprints, universal positioning of hardware to interconnect a plurality of cabinets, and so forth.

More particularly, ANSI standard T1.336 defines individual standards for equipment racks of different depth, and different dimensional footprints. T1.336 for instance provides standard depths of 600 millimeters, 750 millimeters and 900 millimeters. The unique variable depth design described herein produces a single cabinet 700 which is fully compliant with ANSI Standard T1.336 at more than one depth and accordingly at a plurality of dimensional footprints specified by the standards. In other words, a single cabinet 700 meets standards intended for two different cabinets.

For example, the rack may have a maximum depth 708 of 750 millimeters and a minimum depth 706 of 600 millimeters. This range corresponds to two standard depths for cabinets specified by ANSI T1.336. In addition, the rack may be adjusted to a variety of different depths between the maximum and minimum, e.g., anywhere between 600 millimeters and 750 millimeters. Naturally other minimum and maximum depths may be used in other implementations to produce a variety of adjustable dimensioned equipment racks, such as racks configured to adjust between 750 and 900 millimeters, between 600 and 900 millimeters, between 500 and 1000 millimeters and so forth.

In an implementation, cabinet 700 incorporates the embedded structural members previously described in relation to FIGS. 4-5. For example, one or more of the upright members 702 may include a groove to receive a structural insert. Thus, additional dampening materials, strengthening, structural components, and so on may be arranged and rearranged on the cabinet 700 without requiring any design changes to the original cabinet. In an implementation, the structure of cabinet 700 may be configured to withstand a 2000 lb seismic load requirement in compliance with ANSI standards.

In an implementation, cabinet 700 incorporates removable mounting members previously described in relation to FIG. 6. For instance, a variety of mounting members may be removably fastened to the structure of cabinet 700. In this manner cabinet 700 may be configured to mount a variety of telecommunication components 108 which may have a variety of different dimensions. Further, the mounting members may be subsequently reconfigured to allow a different arrangement of equipment within the same cabinet 700.

Figure 8:
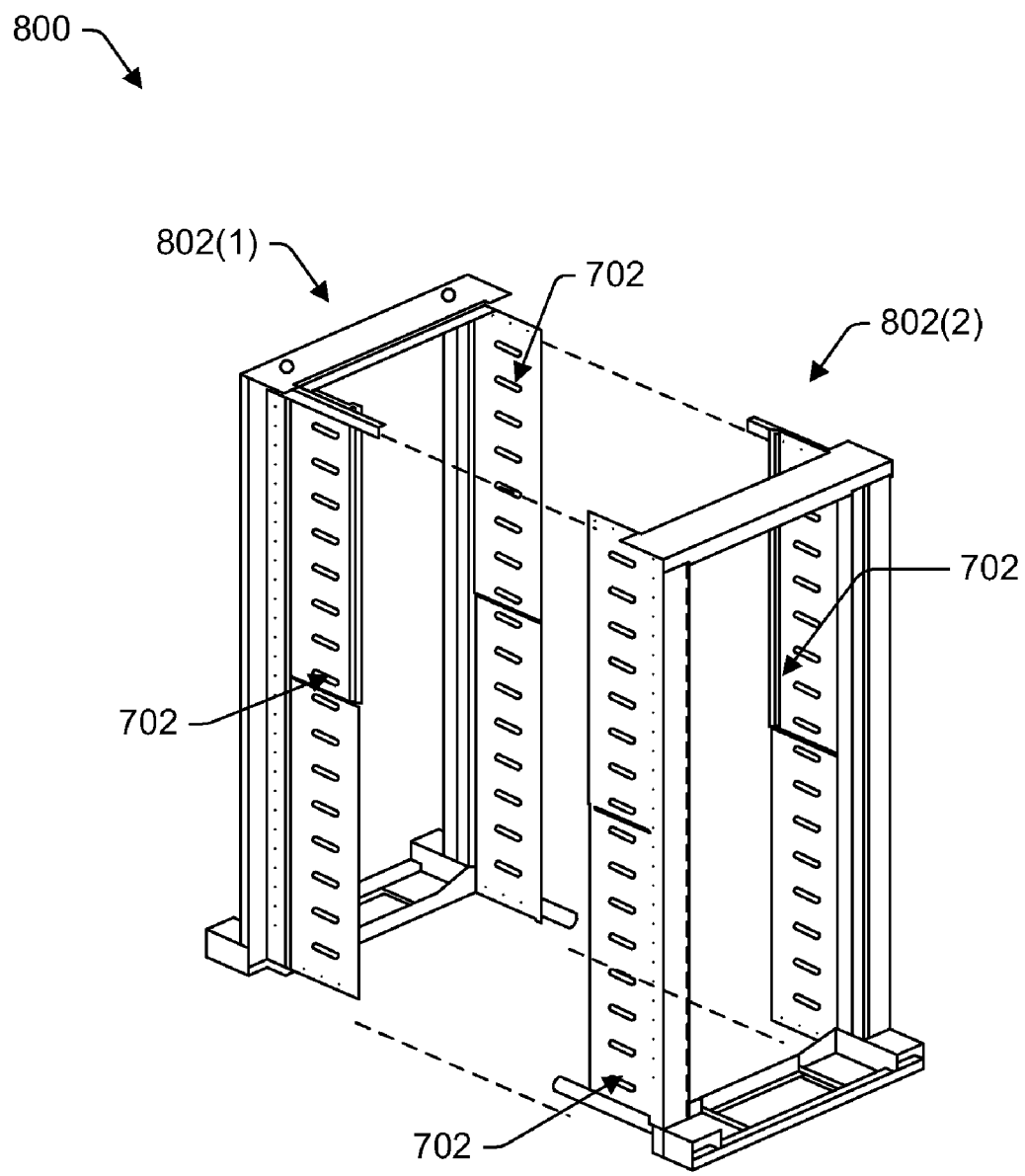
FIG. 8 depicts joining a pair of identical sub-assemblies to form the variable dimension equipment cabinet of FIGS. 7A-7B.

FIG. 8 illustrates an implementation 800 in which identical cabinet sub-assemblies are utilized to form a cabinet such as cabinet 700 of FIGS. 7A-7B. A pair of identical sub assemblies 802(1) and 802(2) is depicted in FIG. 8. The sub-assemblies 802(1), 802(2) have identical front and rear halves of a cabinet 700. As depicted, each of sub assemblies 802(1), 802(2) may further include a pair of the identical upright members 702. The pair of sub-assemblies are joinable to form a complete cabinet, such as cabinet 700 depicted in FIGS. 7A-7B. In order to be joined, the identical sub-assemblies 802(1), 802(2) are oriented such that sub-assembly 802(2) is rotated 180 degrees relative to sub-assembly 802(1). Then cabinet 700 may be assembled in a variety of depths by using fasteners and interlocking uprights as previously described.

Exemplary Procedures

The following discussion describes techniques that may be implemented utilizing the previously described systems and devices. The procedures are shown as a set of blocks that specify operations performed and are not necessarily limited to the orders shown for performing the operations by the respective blocks.

FIG. 9*i* depicts a procedure 900 in an exemplary implementation in which a side wall of a telecommunication cabinet is formed by joining upright members. A pair of identical upright members is formed (block 902). For example, uprights members 302(1) and 302(2) depicted in FIGS. 3A-3C may be formed. The upright members may be formed from a variety of materials, such as various metals, plastics, or rubber. Further, upright members 302(1) and 302(2) are identical and thus may be manufactured as common parts.

The identical uprights are joined in 180 degree rotational relation to form a variable width side wall of a telecommunications equipment cabinet (block 904). Again referring to FIGS. 3A-3C, upright members 302(1) and 302(2) may be joined in a plurality of positions. As depicted in FIGS. 3A-3C, the upright members 302(1), 302(2) are oriented in 180 degree rotational orientation. The upright members 302(1), 302(2) may be joined in an open position (e.g., FIG. 3A), a partially closed position (e.g., FIG. 3B) or fully closed position (e.g., FIG. 3C) to form a side wall of the telecommunications cabinet 106. Each position results in a different corresponding side wall width. Further, upright members 302(1), 302(2) may be joined in a variety of incremental positions between those depicted in FIGS. 3A-3C. A variety of removable fasteners and interlock as previously described may be used, alone or in conjunction, to join the upright members 302(1), 302(2). Accordingly, the upright members 302(1), 302(2) may joined in a plurality of positions such that the width of a corresponding sidewall is variable.

FIG. 10 depicts a procedure 1000 in an exemplary implementation in which a structural insert is removably embedded in a telecommunication cabinet to vary characteristics of the cabinet. A groove configured to receive a structural insert is is formed in a portion of a telecommunication cabinet (block 1002). For instance, the variable structural member 402 of FIG. 4 may be included in one of the plurality of cabinets 106(1)-106(m) of FIG. 1. A U-shaped groove 406 may be formed extending across the length of the variable structural member 402 as depicted in FIG. 4.

A structural insert is removably embedded within the groove to modify a structural characteristic of the corresponding telecommunications cabinet (block 1004). For example, structural insert 408 depicted in FIG. 4 may be removably inserted into the corresponding U-shaped groove 406. The structural insert 408 may be secured in the groove 406 by ordinary fasteners, sliding into the groove, "snapping in" or other removable fastening mechanisms. A variety of insert types may also be used, such as exemplary structural inserts configured as a u-shape 408(1) a unistrut 408(3) and so forth as depicted in FIG. 5.

Each structural insert 408, when inserted within the groove, is configured to modify structural characteristics of the associated telecommunications cabinet. For instance, the structural insert 408 and the variable structural member 402 may be formed from different materials respectively. A relatively high-strength material may be selected for the structural insert 408 such that when inserted into the groove of a variable structural member 402, the strength of the corresponding telecommunications cabinet 106 is increased. A variety of other characteristics may also be varied (such as flexibility, dampening, and so on) by embedding different inserts 408 with different combinations of types, shapes, materials, dimensions and so forth as previously described.

FIG. 11 depicts a procedure 1100 in which telecommunications components are secured within a telecommunications cabinet via a mounting member removably fastened to a support structure of the cabinet. A mounting member is removably fastened to the support structure of a telecommunications cabinet (block 1102). For example, the support structure 602 of FIG. 6 may form a portion of a telecommunications cabinet 106 depicted in FIG. 1. A mounting member such as mounting member 604(1) may be fastened to the support structure 602. For instance, corresponding apertures 606 and 612 on the support structure 602 and mounting member 604 respectively are configured to receive a plurality of fasteners 610 (e.g., bolts, screws, pins and so forth) to fasten the mounting member 604(1) to the interior of support structure 602. In another instance, a mounting member may be fastened to the exterior, e.g., to surface 608 depicted in FIG. 6.

One or more telecommunication components are secured to the cabinet via the removable mounting member (block 1104). The mounting member 604(1) of the previous example is configured with a variety of equipment mountings 614 arranged to allow a variety of different sizes and/or types of telecommunications components to be mounted within a corresponding cabinet 106 via the mounting member 604. For instance, equipment mountings 614 may be arranged with a variety of different types, different spacing, and/or different sizes disposed on mounting member 604(1). Thus, equipment mountings 614 may be utilized to mount one or more components 108 in the cabinet 106.

FIG. 12 depicts a procedure 1200 in an exemplary implementation in which an adjustable depth telecommunications cabinet is formed via a pair of identical sub-assemblies. A pair of identical sub-assemblies is formed (block 1202). For example, sub-assemblies 802(1) and 802(2) depicted in FIG. 8 may be formed. The sub-assemblies together include four identical upright members 702. Each sub-assembly includes two identical upright members 702.

The identical sub-assemblies are joined to form a variable depth telecommunications equipment cabinet (block 1204). For instance, the sub-assemblies 802(1), 802(2) of the previous example may be joined to form a telecommunications cabinet 700 depicted in FIGS. 7A-7B. Telecommunications cabinet 700 is configured to mount plurality of telecommunications components 108 in a telecommunications infrastructure 102. The sub-assemblies 802(1), 802(2) may be joined with a minimum width 706 of FIG. 7A, a maximum width 708 depicted in FIG. 7A, and in a variety of incremental positions between those depicted in FIGS. 7A-7B. Thus, the sub-assemblies 802(1), 802(2) may be joined in a plurality of positions to produce a cabinet 700 having a variety of depths. The various fasteners and interlocking uprights previously described may be used to join the sub-assemblies 802(1), 802(2).

CONCLUSION

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. An adjustable side-wall for a telecommunications equipment cabinet comprising:
    a first upright member;
    a second upright member; and
    a slot provided in each of the first and second upright members, dividing each of the upright members into a first area and a second area, the slot located at a point along a length of each of the first and second upright members, the first area and the second area of each upright member comprising the length of each upright member, wherein the first and second areas of the respective first and second upright members slidably overlap one another by directly mating respective edge portions of said first and second areas along the length of the first and second upright members,
    the first and second areas of each upright member configured to engage the first upright member and the second upright member in an interlocking and alternating overlap such that the first area of the first upright member is disposed over the first area of the second upright member and the second area of the second upright member is disposed over the second area of the first upright member, and
    wherein a mounting surface of the second upright member is oriented perpendicular to a third area of the second upright member and a fourth area offset from the third area of the second upright member.

2. The apparatus described in claim 1 wherein each said upright member has a rectangular side surface which forms the exterior surface of the side wall.

3. The apparatus described in claim 1 wherein:
    each said upright member includes a mounting surface perpendicularly adjoined to a side surface of the upright member; and
    said mounting surface is configured to provide mountings for a plurality of telecommunications components.

4. The apparatus described in claim 1 wherein said upright members are joined via a plurality of securing mechanisms disposed on each upright.

5. The apparatus described in claim 1 wherein said upright members are joined in a closed position by screws, pins, clips or latches.

6. A structural portion of a telecommunications equipment cabinet comprising:
    a first upright member interlocked in one of a plurality of positions with a second upright member; wherein said upright members are:
    identical to each other; and
    removably interlocked at 180 degree rotational orientation, one to another;
    wherein the structural portion of the telecommunications equipment cabinet is configured as an entire structural side wall of the telecommunications equipment cabinet, the structural side wall, having a specified length, including a slot provided in each of the first and second upright members, dividing each of the upright members into a first area and a second area, the first area and the second area of each upright member comprising the specified length of the structural side wall, the first and second areas of each upright member configured to engage the first upright member and the second upright member in an interlocking and alternating overlap, wherein the first and second areas of the respective first and second upright members slidably overlap one another by directly mating respective edge portions of said first and second areas along the length of the first and second upright members,
    wherein the first and second upright members are interlocked such that a plurality of areas of the first upright member overlap a plurality of areas of the second upright member and wherein a mounting surface of the second upright member is oriented perpendicular to a third area of the second upright member and a fourth area offset from the third area of the second upright member.

7. The structural portion described in claim 6, wherein said upright members are configured to be removably interlocked in each of the plurality of positions such that the structural portion has at least one variable dimension.

8. A plurality of upright members for a telecommunication equipment housing, a first upright member of the plurality of upright members comprising:
    a first area;
    a second area offset from the first area; and
    a mounting surface oriented perpendicular to both said areas;
    wherein the offset is configured to align the mounting surface with a mounting surface of a second upright member when the first upright member and the second upright member are removably interlocked in 180 degree rotational relation; and
    wherein the offset is further configured to overlap the first area and the second area of the first upright member with a first area and a second area of the second upright member when the first upright member and the second upright member are removably interlocked in 180 degree rotational relation to form a structural portion of the telecommunication equipment housing, the structural portion of the telecommunication equipment housing configured to form a structural side wall of the telecommunications equipment housing, wherein each of the first and second upright members include a slot, the slot dividing each of the first and second upright members into the respective first and second areas, the slot located at a point along a length of each of the first and second upright members, the first area and the second area of each upright member comprising the length of each upright member, wherein the first and second areas of the respective first and second upright members slidably overlap one another by directly mating respective edge portions of said first and second areas along the length of the first and second upright members, and wherein the mounting surface of the second upright member is oriented perpendicular to a third area of the second upright member and a fourth area offset from the third area of the second upright member.

9. The first upright member and the second upright member as described in claim 8 wherein the offset of the first upright member and the offset of the second upright member correspond to the material thickness of the first upright member and the second upright member.

10. The first upright member and the second upright member as described in claim 8 wherein the slot included in the first upright member is disposed between the first and second areas of the first upright member, and is configured to mate with the slot included in the second upright member when the first upright member and the second upright member are removably interlocked.

11. The first upright member as described in claim 8, wherein the first upright member includes a plurality of interlock positions associated with the first upright member and is configured to interlock with the second said upright member at each of the interlock positions thereby forming a variable width wall.

12. The first upright member as described in claim 8 wherein the mounting surface includes a plurality of mountings to mount a plurality of telecommunication components within a cabinet formed via the first upright member.

13. A method comprising:
forming a pair of identical upright members that are configured to interlock in a plurality of positions; and
joining said upright members in 180 degree rotational relation to form a variable depth side wall of a telecommunications equipment cabinet, the variable depth side wall being configured such that a portion of each of the identical upright members overlap in said interlocking plurality of positions, wherein each of the pair of upright members includes a slot, the slot dividing each of the upright members into a first area and a second area, the slot located at a point along a length of each of the pair of upright members, the first area and the second area of each upright member comprising the length of each upright member, wherein the first and second areas of the respective first and second upright members slidably overlap one another by directly mating respective edge portions of said first and second areas along the length of the first and second upright members and align with a plurality of aperture openings to provide for fasteners that secure said upright members in at least a first depth and a second depth, the first and second areas of each upright member configured to engage the first upright member and the second upright member in an interlocking and alternating overlap such that the first area of the first upright member is disposed over the first area of the second upright member and the second area of the second upright member is disposed over the second area of the first upright member, and wherein the variable depth side wall is adjustable to vary the depth of the telecommunications equipment cabinet between 600 millimeters and 900 millimeters, and wherein a mounting surface of the second upright member is oriented perpendicular to a third area of the second upright member and a fourth area offset from the third area of the second upright member.

14. The method as described in claim 13, wherein said upright members are each configured with a joggle to align a respective mounting surface of one upright member when joined to another upright member, the joggle comprising an offset of the first area with respect to the second area of each upright member.

* * * * *